(12) United States Patent
Han et al.

(10) Patent No.: US 7,067,374 B2
(45) Date of Patent: Jun. 27, 2006

(54) MANUFACTURING METHODS AND STRUCTURES OF MEMORY DEVICE

(75) Inventors: Tzung Ting Han, Yilan (TW); Yin Jen Chen, Wugu (TW); Ming Shang Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/911,959

(22) Filed: Aug. 5, 2004

(65) Prior Publication Data

US 2006/0030112 A1 Feb. 9, 2006

(51) Int. Cl.
*H01L 21/336* (2006.01)

(52) U.S. Cl. ....................... 438/258; 438/211
(58) Field of Classification Search ............... None
See application file for complete search history.

(56) References Cited

U.S. PATENT DOCUMENTS

| | | | |
|---|---|---|---|
| 5,340,760 A * | 8/1994 | Komori et al. | 438/258 |
| 5,362,666 A * | 11/1994 | Dennison | 438/396 |
| 5,899,722 A | 5/1999 | Huang | |
| 6,074,912 A * | 6/2000 | Lin et al. | 438/253 |
| 6,177,307 B1 * | 1/2001 | Tu et al. | 438/241 |
| 6,211,012 B1 | 4/2001 | Lee et al. | |
| 6,271,087 B1 * | 8/2001 | Kinoshita et al. | 438/258 |
| 6,468,904 B1 | 10/2002 | Chen et al. | |
| 6,482,699 B1 * | 11/2002 | Hu et al. | 438/258 |
| 6,503,806 B1 | 1/2003 | Kim | |
| 6,555,865 B1 * | 4/2003 | Lee et al. | 257/314 |
| 6,815,283 B1 * | 11/2004 | Lee | 438/211 |

* cited by examiner

*Primary Examiner*—David Nelms
*Assistant Examiner*—David Goodwin
(74) *Attorney, Agent, or Firm*—Haynes Beffel & Wolfeld; Mark Haynes

(57) ABSTRACT

Dual spacer structures are fabricated such that sidewall spacers in a cell region are thinner than sidewall spacers in a periphery region. The fabricating method of memory includes forming a stop layer over the first semiconductor feature and the second semiconductor feature in cell region and periphery region. A spacer layer is formed over the stop layer in the periphery region. The spacer layer is patterned to form a spacer on a sidewall of the second semiconductor feature. An etching process is performed to form a resultant spacer on an interior sidewall of the opening between first semiconductor features. The stop layer on top surfaces of the first and second semiconductor features is removed.

13 Claims, 5 Drawing Sheets

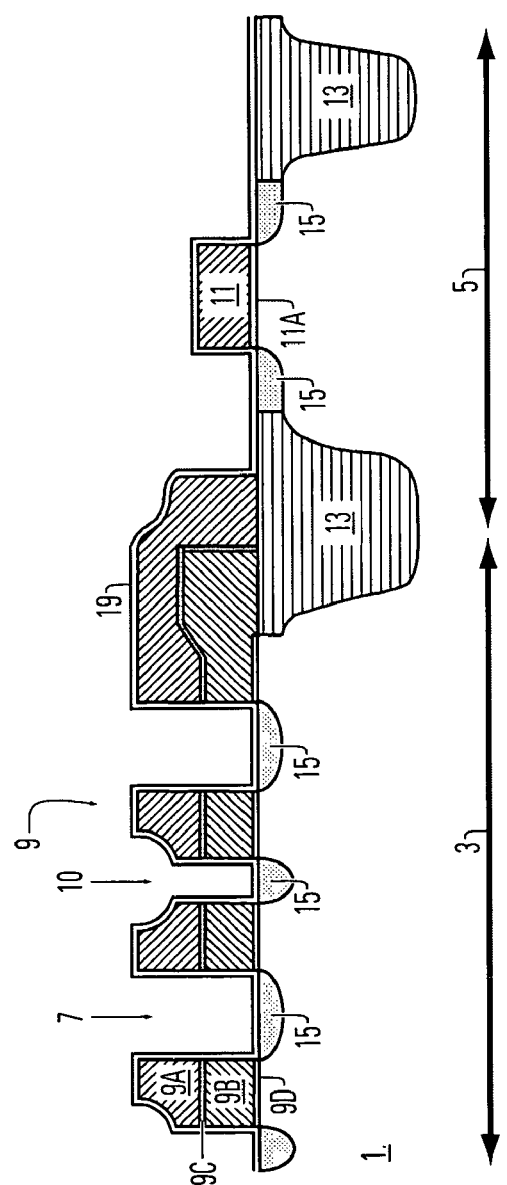
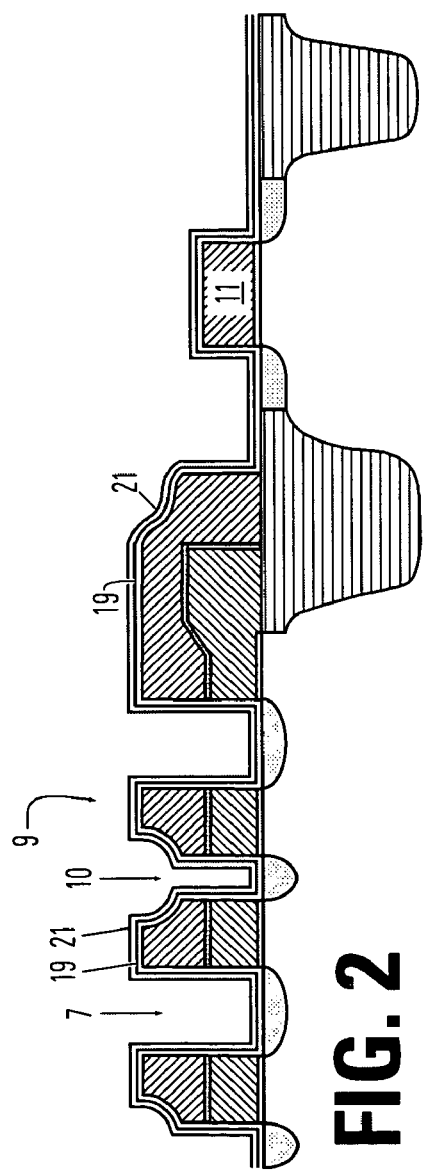
FIG. 1
FIG. 2

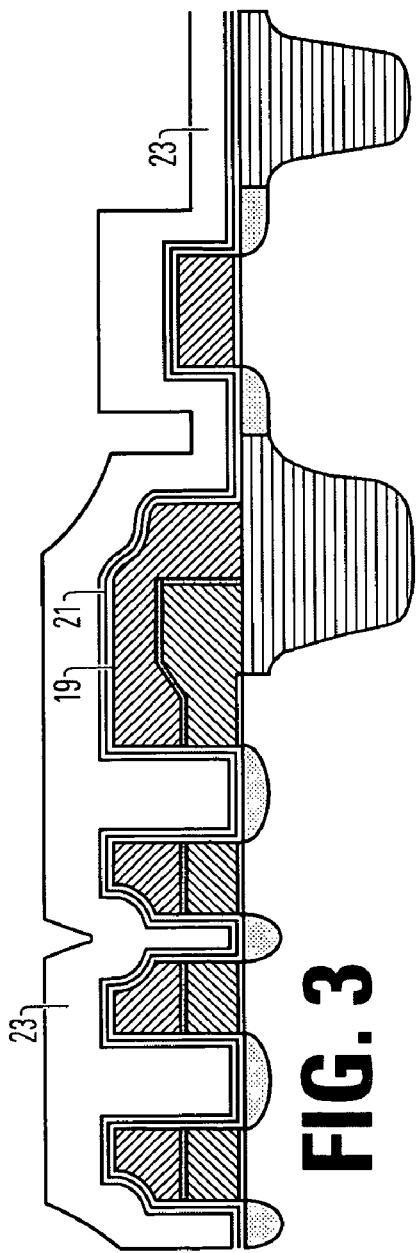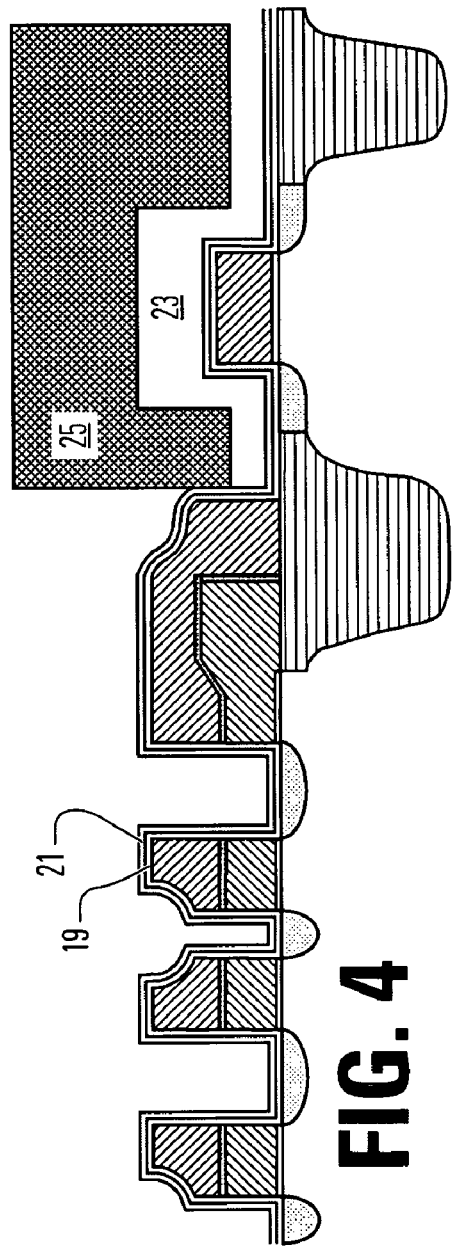

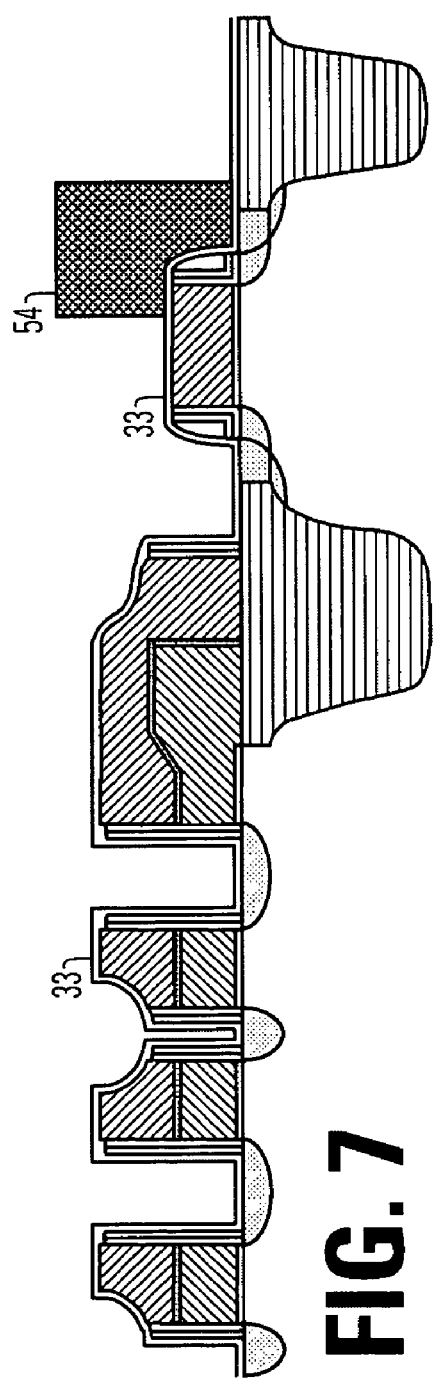
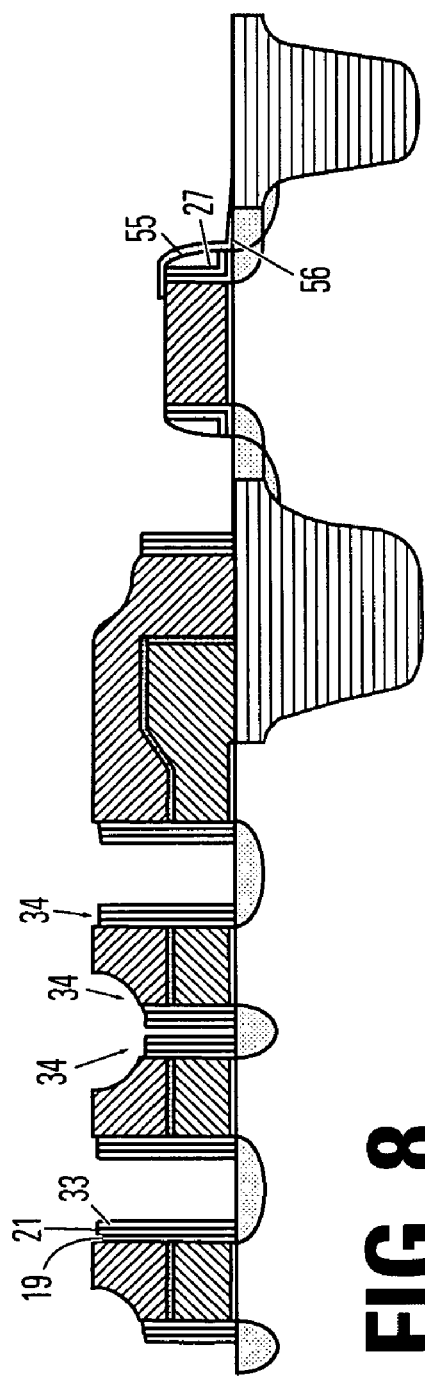

MANUFACTURING METHODS AND STRUCTURES OF MEMORY DEVICE

BACKGROUND OF THE INVENTION

1. Field of the Invention

The present invention relates to semiconductor fabrication methods and structures and, more particularly, to a method and structure of fabricating memory device with dual spacers in cell and periphery region.

2. Description of Related Art

Integrated circuits are well known. Integrated circuits are commonly used to make a wide variety of electronic devices, such as memory chips. There is a strong desire to reduce the size of integrated circuits, so as to increase the density of the individual components thereof and consequently enhance the functionality of an integrated circuit. As device densities increase with reduced feature width, the aspect ratio also increases. However, higher aspect ratios resulting from formation of features on a substrate separated by small gaps, can reduce the effective process windows for etching processes and deposition processes. For example, the interlayer dielectric layer gap fill-in process and silicide deposition process windows in the memory cell region on an integrated circuit memory reduce as device densities and aspect ratios increase for memory cell gate features that result in the gaps.

In addition, for devices with plural circuit regions, such as memory devices, the circuit regions may have different performance requirements that are reflected in the manufacturing processes. In memory devices, for example, the memory cell region requires high reliability and high density, while some circuits in the periphery require high breakdown voltage. One common process used in integrated circuit manufacturing for formation of small features is known as the sidewall spacer. Sidewall spacers are used to define features, by the width of the spacer, with widths possible that are less than the minimum feature width of the lithography process. However, the features defined using sidewall spacers for one region in an integrated circuit may not be useful in another region due for example, to different performance requirements in the different regions.

There is a need for a method and structure to achieve these different performance requirements in memory chips and other integrated circuit devices having multiple circuit regions.

SUMMARY OF THE INVENTION

Accordingly, the present invention has been made in an effort to solve the problems occurring in the related art. A dual spacer process is disclosed, used in fabricating devices having plural circuit regions, such as memory devices. The multiple circuit regions have different spacer widths. For memory devices for example, memory cell reliability and periphery device performance can be improved at the same time. For memory devices, the dual spacer process can be applied to decrease memory cell size and reduce manufacturing complexity, while achieving necessary high voltage performance in the periphery circuit region. In the disclosed examples, the resultant spacer in the cell is thinner than the resultant spacer in the periphery region. The thinner spacer in the cell increases the width of openings, and thereby reduces aspect ratios, which improves interlayer dielectric (ILD) fill-in and silicide deposition process windows. The thicker spacer in the periphery can gain good reliability for high voltage operation.

In accordance with one aspect, the disclosed technology provides a method of fabricating an integrated circuit with dual spacers. In this method, a substrate has a first region and a second region. The first region comprises at least two adjacent first semiconductor features and an opening between the first semiconductor features. The second region comprises a second semiconductor feature. A stop layer is formed over the first and second region. A spacer layer is formed over the stop layer in the second region. The spacer layer is patterned to form a spacer on a sidewall of the second semiconductor feature. An etching process is performed to form a resultant spacer on an interior sidewall of the opening between first semiconductor features. The stop layer on top surfaces of the first and second semiconductor features is removed.

In accordance with another aspect, the present invention provides an integrated circuit with dual spacers. In this structure, a semiconductor substrate has a first region and a second region. The first region comprises at least two adjacent first semiconductor features and an opening between the first semiconductor features. The second region comprises a second semiconductor feature. A stop layer is on an interior sidewall of the opening between first semiconductor features, and on a sidewall of the second semiconductor feature and over the adjacent portion of the substrate in the second region. A spacer is on the surface of the stop layer in the second region.

BRIEF DESCRIPTION OF THE DRAWINGS

FIG. 1 shows a result of forming a dielectric layer over a semiconductor structure of a cell region and a periphery region on a semiconductor substrate;

FIG. 2 shows a result of forming a thin stop layer over the dielectric layer;

FIG. 3 shows a result of forming a spacer layer over the stop layer;

FIG. 4 shows a result of forming a patterned photoresist layer on the periphery region and removing the spacer layer exposed by the photoresist layer;

FIG. 7 shows a result of forming a cover layer over the structure illustrated in FIG. 6 and forming a patterned photoresist layer on the periphery region;

FIG. 8 shows a result of etching the structure illustrated in FIG. 7; and

DETAILED DESCRIPTION OF THE PRESENTLY PREFERRED EMBODIMENTS

Figure 5:
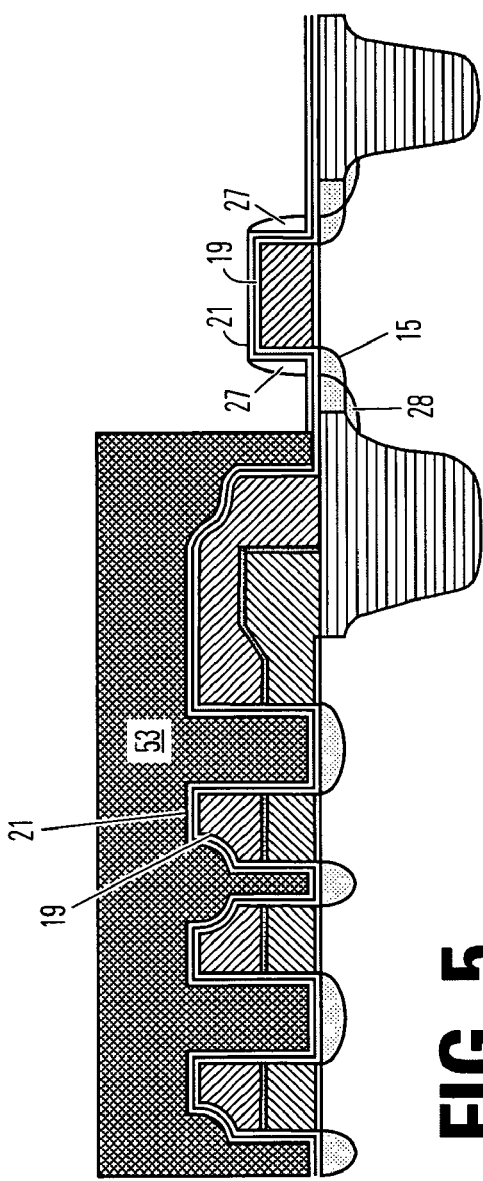
FIG. 5 shows a result of forming a patterned photoresist layer on the cell region and forming a spacer on the periphery region.

Reference will now be made in detail to the presently preferred embodiments of the disclosed technology, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, and rear are used with respect to the accompany drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of invention as defined by the appended claims.

A detailed description of embodiments of the present invention is provided with reference to FIG. 1 to FIG. 10.

Referring now to FIG. 1, a semiconductor structure has a cell region 3 and a periphery region 5 of a semiconductor substrate 1. The cell region 3 is one example of a first region to be manufactured with thin sidewall spacers and the periphery region 5 is one example of a second region to be manufactured with thicker sidewall spacers. The cell region 3 is isolated from the periphery region 5 by dielectric region 13. The dielectric region 13 is formed by depositing oxide or other dielectric within a trench, by LOCOS oxidation, or otherwise as known in the art.

In the illustrated example, the cell region 3 comprises at least two adjacent flash memory stacked gates 9, an opening 10 (also called a gap) between the stacked gates 9, and a plurality of doped regions 15 which are formed in the substrate 1 on each side of the stacked gates 9 to serve as sources and drains. Additional pairs of stacked gates are separated from the two adjacent stacked gates by opening 7. Opening 7 is wider than opening 10, to allow for contact formation for example, such as embodiments implementing ETOX flash memory cells. The stacked gate 9, serves as a "first semiconductor feature" in embodiments of the technology on which a thinner sidewall spacer is formed, and comprises a polysilicon transistor gate 9A, a polysilicon floating gate 9A, an inter-poly dielectric layer 9C, and a tunnel dielectric layer 9D. Other memory cell structures, including but not limited to silicon-oxide-nitride-oxide-silicon SONOS cells with stacked gate structures having charge trapping nitride layers rather than floating gates, are used in other embodiments. In various embodiments of the invention, the stacked gate 9 comprises at least two conductive layers, such as two polysilicon layers, or one polycide layer and two polysilicon layers.

The periphery region 5 comprises n-channel and p-channel transistors for logic, high voltage circuits and other circuits supporting operation of the memory cell region, including a representative transistor including a transistor gate structure 11, a gate dielectric layer 11 A, and two doped regions 15 formed in the substrate 1 on each side of the gate structure 11 to serve as first implant regions for double diffused sources and drains in this example. The transistor gate structure 11 comprising polysilicon for example, serves as a "second semiconductor feature" in embodiments of the technology on which a thicker sidewall spacer is formed. The transistor gate structure 11 comprises at least one conductive layer, such one polysilicon layer, or one polysilicon layer and one polycide layer.

After forming the stacked gate (9A-9D) and transistor gate (11,11 A) features, a dielectric layer 19 is formed over the semiconductor substrate 1 in the cell region 3 and in the periphery region 5. The dielectric layer 19 conformally covers the surfaces of the stacked gate (9A–9D) and the transistor gate (11,11 A) structures, including the interior sidewalls of the openings 7 and 10 between the stacked gates (9A–9D). The dielectric layer 19 in the illustrated example comprises an oxide film having a thickness between 20 Å and 300 Å formed by conventional thermal oxidation process. The thermal oxidation process is typically employed to both grow oxide and thermally anneal the semiconductor substrate 1 to repair damage caused when patterning the stacked gates 9 and transistor gate structures 11.

FIG. 2 illustrates the formation of a stop layer 21 over the dielectric layer 19 shown in FIG. 1. The stop layer 21 is a dielectric layer, having a etch chemistry that is different than that of a following layer to be formed. In this example, the stop layer 19 comprises a silicon nitride film formed by conventional a chemical vapor deposition CVD process. Other materials suitable as an etch stopping function can be used. For silicon nitride CVD, precursors of a suitable the chemical vapor deposition process are dichlorosilane ($SiH_2Cl_2$) and either ammonia ($NH_3$) or nitrogen gas ($N_2$). The stop layer 21 in this example has a thickness between 20 Å and 300 Å. The stop layer acts as an etching stop layer for the process described in FIG. 4.

Next, as depicted in FIG. 3, a spacer layer 23 is formed over the stop layer 21. The spacer layer 23 comprises a dielectric, a TEOS oxide film in this example, formed by conventional CVD process. The spacer layer 24 in this example has a thickness between 500 Å and 2000 Å.

As shown in FIG. 4, the spacer layer 23 in the cell region 3 is removed by etching process, which is preferably a wet etching process stopped by the etch stopping layer 21. A patterned photoresist layer 25 is formed upon the spacer layer 23 protecting the periphery region 5, an etching process is performed to remove the spacer layer 23 in the cell region 3 exposed by the photoresist layer 25. The etching processes leaves the portion of spacer layer 23 in the periphery region 5. The stop layer 21 serves as an etching stop layer during removal the spacer layer 23 over the cell region 3.

Referring to FIG. 5, a spacer 27 is formed on the surface of the stop layer 21 on the sidewall of the transistor gate structure 11 in the periphery region 5. As illustrated, a patterned photoresist layer 53 is formed over the stop layer 21 protecting the cell region 3, and exposing the spacer layer 23 in the periphery region 5. A first etching process, which is preferably an anisotropic etching process, is performed on the spacer layer 23 exposed by the photoresist layer 53 to form a spacer 27. It is acceptable if some amount of the dielectric layer 19 and the stop layer 21 are also removed in the side wall etch step, as long as the amount is controlled. The resulting spacers 27 have widths that are determined by the thickness of the spacer layer 23, after the etch process, combined with the thickness of the dielectric layer 19 and the stop layer 21 on the side wall of the gate structure 11.

The spacers 27 in this example act as masks for dopant implants 28 in the source and/or drain regions of peripheral transistors to form double diffused source and drain structures, which improve high voltage operation by increasing the breakdown voltages on the transistors. (The drawings are not to scale.) Spacers 27 in the peripheral region 5, used for manufacturing high voltage transistors for example, can be made a thick as necessary, without impacting spacer widths in the cell region 3. In one exemplary process, the sidewall spacer widths in the periphery region 5 are increased from about 0.07 microns, as would be limited by cell region parameters, to 0.14 microns, without sacrificing cell density.

Figure 6:
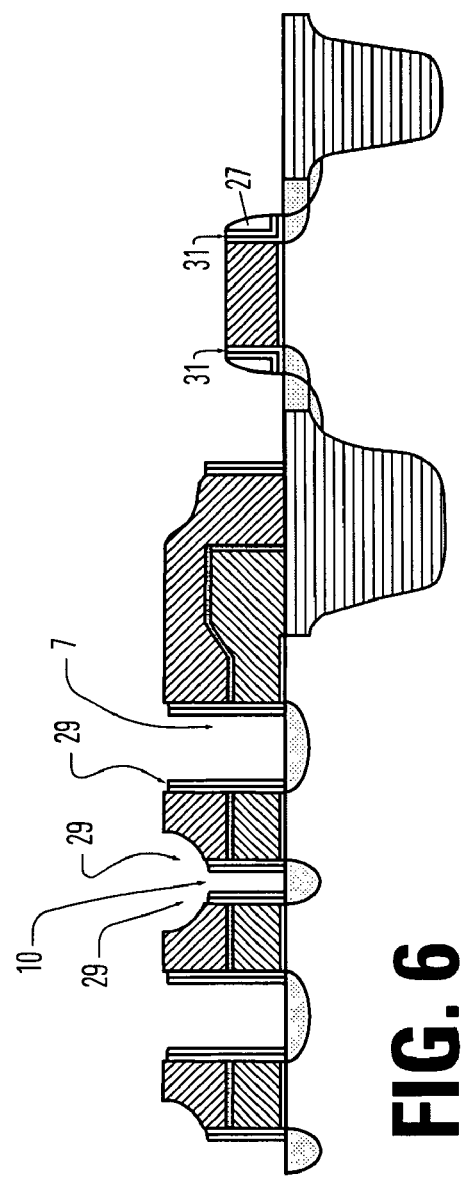
FIG. 6 shows a result of forming a first line structure and a second line structure.

Turning to FIG. 6, first line structures 29 and second line structures 31, consisting of the dielectric layer 19 and the stop layer 21 result from this process. A second etching process is performed to remove the dielectric layer 19 and the stop layer 21 on top surfaces of the stacked gates 9, transistor gate structure 11 and on the surfaces of the substrate in the cell region 3 and the periphery region 5. This leaves portions of the surface of the substrate exposed, over the source and drain regions of the memory cells in the cell region and over the source and drain regions of the transistors in the periphery region. The first line structure 29 is formed on the sidewalls of the stacked gates 9, including the interior sidewall of the opening 10 and of the opening 7. The second line structure 31 is formed on the sidewall of the transistor gate structure 11 and over the adjacent portion of the substrate beneath the spacers 27 in the periphery region 5, and between the spacer 27 and the gate structure 11. The first line structure 29 acts as the resultant spacer on the sidewalls of the stacked gates 9 in the cell region 3. The resultant spacer is thinner than the spacer 27 on the transistor gate structure 11 in the periphery region 5. It can be seen that dual spacer structures are formed in the cell region 3 and periphery region 5.

As FIG. 7 shows, a cover layer 33 is formed over the structure illustrated in FIG. 6 and a patterned photoresist layer 54 is formed over the cover layer 33 on the transistor gate structure 11 and the adjacent portion of the substrate 1 in the periphery region 5. The cover layer 33 comprises a dielectric in this example, other than that to be later used over the source and drain regions. The cover layer 33 in one example is silicon nitride formed by conventional CVD process, and acts in place of silicon dioxide in a resist protective oxide RPO process known in the art. The cover layer 33 preferably has a thickness between 20 Å and 300 Å.

In FIG. 8, an etching process is performed to remove the cover layer 33 exposed by the photoresist layer 54 in the cell region 3 and the periphery region 5, and define a patterned cover layer 55 in the periphery region 5, and a composite spacer 34 in eth cell region. The patterned cover layer 55 is formed over at least part of the surface of the transistor gate structure 11, of the surface of the spacer 27 and of the adjacent portion 56 of the substrate 1 in the periphery region 5. A composite spacer 34, which is composed of the dielectric layer 19, the stop layer 21 and the cover layer 33, is formed on the sidewalls of the stacked gates 9. The cover layer is also removed from the surface of the sidewall spacer 27, in the illustrated example, but may not be in all embodiments.

Figure 9:
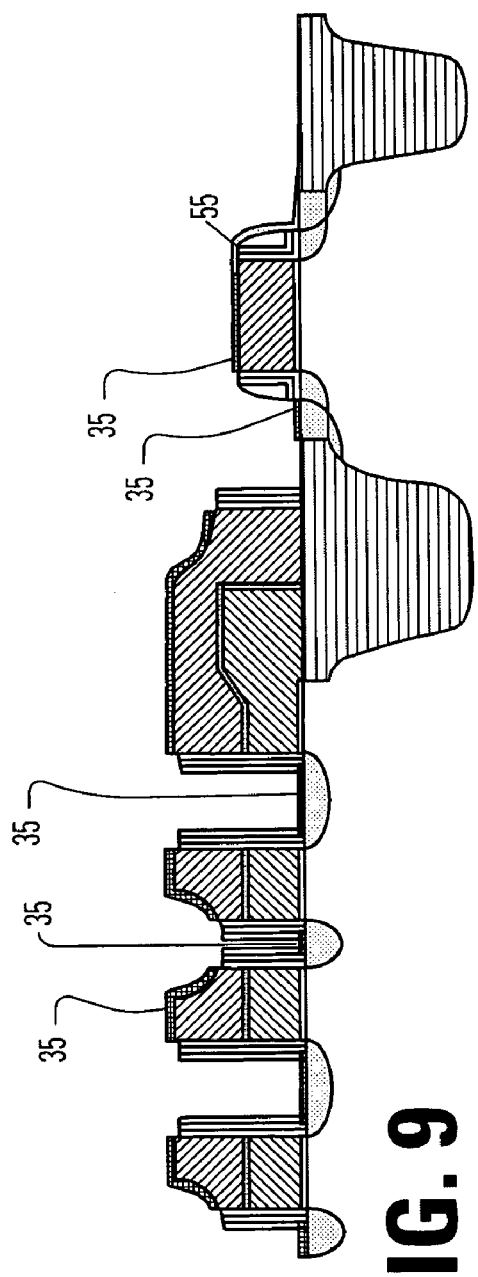
FIG. 9 shows a result of forming a silicide structure.

Referring now to FIG. 9, a silicide structure 35, comprising for example cobalt silicide, is formed over at least part of the top surfaces of the stacked gate 9 and transistor gate structure 11, and over the exposed surfaces of the substrate 1 in the cell region 3 and the periphery region 5. A formation of the silicide structure 35 reduces the resistance of the bit lines and word lines on which it is formed. Reduced resistance can translate into enhanced operating speed. By the thinner spacers in the cell region, the step coverage process margin for the silicide formation is relaxed, resulting in better manufacturing yields. The patterned cover layer 55 prevents formation of silicide in the protected area.

Figure 10:
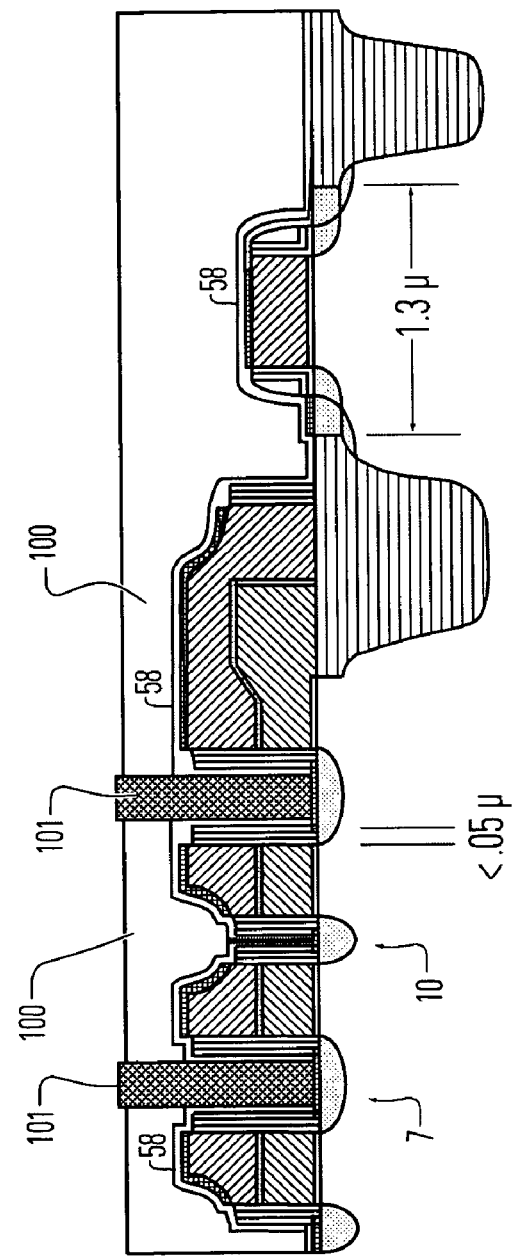
FIG. 10 illustrates interlayer dielectric fill and contact structures formed over the silicide structure.

Turning to FIG. 10, after formation of the silicide structures, a borderless stop layer 58 comprising silicon nitride for example is formed over the substrate. An interlayer dielectric fill 100 is formed over the borderless stop layer. The interlayer dielectric ILD fill 100 typically comprises a silicon dioxide material deposited by known processes. Because of the thinner spacers in the cell region, the process window margin for the ILD fill is increased. For example, in one process the gap to be filled is increased from about 0.11 microns to over 0.2 microns, greatly improving reliability without increasing cell size (drawing not to scale). Contact structures 101 are formed on the wider regions 7 on the drain side of stacked gate structures in the cell region by processes known in the art, including a contact etch which is stopped by the borderless stop layer, etching the borderless stop layer in the openings for the contacts, and contact metal fill processes. The interlayer dielectric fill and contact structure formation processes have improved process window margins due to the thinner side walls in the memory cell regions 3, and while supporting high voltage transistors in the peripheral region due to the thicker side walls in the periphery region 5. For example, because of the wider openings available according to the present invention on the drain sides of the cells, the borderless stop layer can be reliably formed with greater thickness than prior art approaches, allowing greater process window margin during contact etch.

The technology is particularly suited to the manufacture of dual spacer flash memory having a small cell size and high-density memory with integrated high voltage circuitry in the perphery.

According to the embodiment of the invention, the advantages of the invention include:

1. This invention provides a dual spacer process and structure. The cell and periphery have different spacer widths. The resultant spacer is thinner related to the spacer on the transistor gate structure the periphery region. Cell reliability and periphery device performances can be improved at the same time. The resultant spacer in the cell gets low stress on the device and improves the data retention. The spacer in the periphery can gain higher breakdown voltage operation.
2. The dual spacer process and structure decrease memory cell size and reduce manufacturing difficulty.
3. The resultant spacers are formed on the interior sidewalls of the opening between the stacked gates. The resultant spacers reduce the width of spacers made by conventional method and increase the width in the opening and cause less structural stress on the memory cells. The interlayer dielectric (ILD) fill-in process, etching process and silicide deposition process window margins can be increased.

In addition, besides flash memory, this invention can also apply to all forms of memory devices, e.g., EPROM, EEPROM, DRAM and SRAM. The first semiconductor feature and the second semiconductor feature comprise transistor gate structure, transistors and lines. It is to be understood and appreciated that the process steps and structures described herein do not cover a complete process flow for the manufacture of the memory device. The present invention can be practiced in conjunction with various integrated circuit fabrication technologies that are used in the art, and only so much of the commonly practiced process steps are described herein as are necessary to support the claims and provide an understanding of the invention.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. An integrated circuit structure comprising:
a substrate having a first region and a second region, wherein said first region comprises at least two adjacent first semiconductor features and a region between said two adjacent first semiconductor features, and second region comprises a second semiconductor feature;

a dielectric layer on an interior sidewall of said opening between first semiconductor features, and on a sidewall of said second semiconductor feature and over the portion of the substrate adjacent the sidewall of said second semiconductor feature;

a stop layer in the first region over the dielectric layer on an interior sidewall of said opening between said two adjacent first semiconductor features, and in the second region on a sidewall of said second semiconductor feature and over a portion of the substrate adjacent the sidewall of said second semiconductor feature;

a spacer on the surface of said stop layer in said second region;

a patterned cover layer over the stop layer on an interior sidewall of said opening between said two adjacent first semiconductor features and over atleast part of the top surface of said second semiconductor feature, the surface of said spacer and the portion of the substrate adjacent the sidewall of said second semiconductor feature; and a silicide structure only in regions not covered by the patterned cover layer, and over at least part of the top surface of said first and second semiconductor features, and over a surface of the substrate in said region between said two adjacent first semiconductor features in the first region.

2. The integrated circuit structure according to claim 1, wherein said first semiconductor feature comprises a polysilicon gate.

3. The integrated circuit structure according to claim 1, wherein said first semiconductor feature comprises at least two conductive layers.

4. The integrated circuit structure according to claim 1, wherein said second semiconductor feature comprises a polysilicon gate.

5. The integrated circuit structure according to claim 1, wherein said dielectric layer is an oxide film.

6. The integrated circuit structure according to claim 1, wherein said dialectic layer is formed to have thickness of 20–300 Å.

7. The integrated circuit structure according to claim 1, wherein said stop layer is a dielectric layer.

8. The integrated circuit structure according to claim 1, wherein said stop layer is a nitride film.

9. The integrated circuit structure according to claim 1, wherein said stop layer is formed to have thickness of 20–300 Å.

10. The integrated circuit structure according to claim 1, wherein said spacer is an oxide film.

11. The integrated circuit structure according to claim 1, wherein said cover layer is a nitride film.

12. The integrated circuit structure according to claim 1, wherein said first semiconductor structure comprises a stacked gate structure for a flash memory cell.

13. The integrated circuit structure of according to claim 1, including a dielectric fill layer over said suicide structure, and a contact through the dielectric fill layer in the region between said two adjacent first semiconductor structures in the first region.

* * * * *